(12) United States Patent
Tan

(10) Patent No.: US 8,093,085 B2
(45) Date of Patent: Jan. 10, 2012

(54) METHOD OF FORMING SUSPENSION OBJECT ON MONOLITHIC SUBSTRATE

(75) Inventor: Siew Seong Tan, Hsinchu (TW)

(73) Assignee: Memsor Corporation, Hsinchu (TW)

( * ) Notice: Subject to any disclaimer, the term of this patent is extended or adjusted under 35 U.S.C. 154(b) by 0 days.

(21) Appl. No.: 12/816,231

(22) Filed: Jun. 15, 2010

(65) Prior Publication Data
US 2011/0306158 A1    Dec. 15, 2011

(51) Int. Cl.
*H01L 21/00* (2006.01)

(52) U.S. Cl. ............ 438/51; 438/42; 438/63; 438/110; 257/E21.499; 257/E21.532

(58) Field of Classification Search .............. 438/55, 438/63; 257/E21.5, E21.532, E21.533, E21.536, 257/E21.702
See application file for complete search history.

(56) References Cited

U.S. PATENT DOCUMENTS
6,712,983 B2 * 3/2004 Zhao et al. ............ 216/2
* cited by examiner

*Primary Examiner* — Cheung Lee
(74) *Attorney, Agent, or Firm* — Birch, Stewart, Kolasch & Birch, LLP

(57) ABSTRACT

A method of forming a suspension object on a monolithic substrate is provided. A silicon base layer of the monolithic substrate has a circuit layer composed of at least one wet etching region, at least one circuit region, and at least one microstructure region. The wet etching region is used to partition the circuit region and the microstructure region, and extends downwards to a surface of the silicon base layer, so as to form an etching path for etching the silicon base layer from above the substrate. Next, an upper surface and a lower surface of the silicon base layer are respectively etched through dry etching, such that the microstructure region is suspended.

19 Claims, 6 Drawing Sheets

METHOD OF FORMING SUSPENSION OBJECT ON MONOLITHIC SUBSTRATE

BACKGROUND OF THE INVENTION

1. Field of the Invention

The present invention relates to a method of forming a suspension object on a monolithic substrate, and more particularly to a method capable of precisely releasing and suspending a microstructure on a monolithic substrate by using a process combining an anisotropic dry etching method and a wet etching method, on the monolithic substrate integrating an integrated circuit (IC) and the microstructure.

2. Related Art

With the quick development of the IC process and the evolution of the market demands, ICs having different properties and different processes may be finished gradually after being integrated on the same chip, such that as compared with the system achieved by using a plurality of chips through a wire bonding configuration, the formed system-on-chip (SOC) has a higher and more stable IC capacity, and the SOC, advantageous in being light, thin, short, and small, being power saving, and having a high integrity, results in a greatly improved market competitiveness of the product.

In another aspect, the SOC may also be applied to the process technique of integrating the micro machine, such that the suspension microstructure and the IC circuit are integrated on a single chip. Complementary metal oxide semiconductor (CMOS)-Compatible micro electro mechanical systems (MEMS) (CMOS-Compatible MEMS) is a technique combining the semiconductor CMOS circuit process and the MEMS, in which the IC circuit and the MEMS are integrated on the same silicon chip with the same design interface, and then a silicon micromachining technique of the MEMS is used for auxiliary, so as to manufacture the suspension microstructure of the MEMS on the silicon chip, such that the suspension microstructure may generate mechanical motion. According to the sequence of manufacturing the MEMS and the CMOS circuit, the process may be classified into the following modes. (A) The process of etching the MEMS structure and the IC process are used together, so as to etch holes to be etched under the MEMS structure when the IC circuit is laid or etched. (B) The IC circuit and the MEMS structure are integrated on the same chip with the same design interface, and then a suspension microstructure is manufactured on a silicon wafer by using the silicon micromachining technique of the MEMS. Although the holes under the MEMS structure may be easily etched in the mode (A), the original equipment manufacturer (OEM) needs to change the original processing steps to match with the MEMS process, which results in a high cost, and requires a more precise calculation to increase the yield of the product. If the products do not exist in quite a large quantity, the MEMSs are not manufactured by the OEM.

Therefore, most of the MEMS products are manufactured by using a post-process of the mode (B). The MEMS structure is stacked on an etched layer, and then the MEMS structure is processed and released by using the post-process. Although the etching step is complicated, it is unnecessary to design a new silicon wafer process for the specific MEMS product. Meanwhile, as compared with the mode (A), the mode (B) utilizing the existing standardized CMOS process is more easily developed, and saves much manufacturing cost.

The conventional etching method is classified into two types. One is a common wet etching method, in which the etching is performed by using the specific chemical reaction of a chemical solution to the chip. The other is a dry etching method, which is usually a plasma etching, in which ions in the plasma impact the material of a surface of the chip and make the material to fall off, or the etching is performed by using the mechanical reaction between active free-radicals in the plasma and atoms on the chip.

In the wet etching method, usually an etchant used to exclusively etch the specific material can be found, such that although the wet etching method belongs to a diffusion type isotropic etching, the etchant has a specificity on the material, such that patterns may be etched on the chip with a mask made of special materials on the surface of the chip. However, the etching mode is still the isotropic etching, so an aspect ratio of the etching is usually small.

The etching mode of the dry etching method achieves the etching effect by using the impacting force of the ions, such that the dry etching may perform a directional anisotropic etching having an aspect ratio achieving a depth greater than 5:1, or may even use a deep reactive ion etching (RIB) to achieve an aspect ratio up to 30:1.

Therefore, when it intends to etch the suspension object structure having an aspect ratio more than five times that of the conventional mode (B), mostly the dry RIE method is adopted, so as to achieve the anisotropic etching having a higher aspect ratio. In U.S. Pat. No. 6,712,983, Zhao et al., a two-stage dry etching method is disclosed. Referring to FIGS. 4A-4B, a two-dimensional pattern on a microstructure a0 is formed through anisotropic etching by using a photoresist layer a2 above a circuit layer a1 as a mask (as shown in FIG. 4B), in which an etching depth reaches to a silicon base layer a3 under the circuit layer a1 (as shown in FIG. 4C). Then, the silicon base layer a3 under the microstructure a0 is etched through semi-anisotropic dry etching (as shown in FIG. 4D). Finally, the silicon base layer a3 under the microstructure a0 is further etched to form a hole through isotropic dry etching, such that the microstructure a0 is released and suspended (as shown in FIGS. 4D-4E). In U.S. Pat. No. 6,712,983, the microstructure having the high aspect ratio is obtained through etching, but the processing steps are complicated with strict processing demands, and are time and labor consuming, and the size and the shape of the hole under the microstructure region cannot be precisely controlled through etching. In addition, referring to FIGS. 5A to 5C, after the etching is finished and the single chip is packaged, when it intends to separate each microstructure a0, a cap a4 needs to be cut to perform an etching process again, such that not only the complexity and the cost of the process are increased, but also the process needs to have a detailed consideration and calculation on a mechanical configuration of the microstructure.

Although the dry etching method may achieve the higher aspect ratio, the etching speed thereof is much slower than that of the wet etching method, and the cost is higher. Further, when a size of the MEMS structure is changed, the new dry etching process, the proportion of ingredients, and the etching time etc. need to be tested again, which, however, greatly increases the time, the man power, the material resources, and the material cost for developing the MEMS chip.

Accordingly, in order to solve the problem how to combine the advantages of the quick and cheep etching manner of the wet etching method and the high aspect ratio of the dry etching method, simplify and accelerate the process, and reduce the manufacturing cost and material cost, the inventor proposes the present invention through years of experiences and continuous research and development.

SUMMARY OF THE INVENTION

The present invention is mainly directed to a method of forming a suspension object on a monolithic substrate. The monolithic substrate is composed of a silicon base layer and a circuit layer above the silicon base layer. The circuit layer has at least one wet etching region, at least one circuit region, and at least one microstructure region. The wet etching region is disposed between the circuit region and the microstructure region, and extends downwards to a surface of the silicon base layer. Therefore, when the microstructure region is released, a material in the wet etching region is removed through wet etching, so as to form an etching path for etching the silicon base layer. Then, the silicon base layer on a bottom of the wet etching region is etched to a predetermined etching depth through the etching path through anisotropic dry etching. Next, the silicon base layer under the microstructure region is etched through the anisotropic dry etching, so as to release the microstructure region and form the suspension object on the monolithic substrate.

The present invention is also directed to a method of forming a suspension object on a monolithic substrate. A circuit layer of the monolithic substrate has a plurality of circuit regions and a plurality of wet etching regions, and the wet etching regions are disposed on boundaries of the circuit regions, so as to partition the circuit regions. Therefore, when the suspension object is formed, through holes for separating the circuit regions are formed among the circuit regions, such that after packaging by caps is finished, the caps are directly cut at positions among the circuit regions, thereby separating the circuit regions.

The present invention is further directed to a method of forming a suspension object on a monolithic substrate, which is capable of etching to a required thickness of a microstructure region through back etching, thereby strengthening the structural strength of the microstructure region, and enhancing the representation sensitivity and reliability of the microstructure region.

In order to achieve the above objectives, the present invention provides a method of forming a suspension object on a monolithic substrate, which includes the following steps.

(a) A monolithic substrate is provided, in which the monolithic substrate is composed of a silicon base layer and a circuit layer above the silicon base layer, the circuit layer has at least one wet etching region, and the wet etching region extends to a surface of the silicon base layer.

(b) A material in the wet etching region is removed until the silicon base layer through wet etching.

(c) The silicon base layer on a bottom of the wet etching region is etched to a predetermined etching depth through anisotropic dry etching.

(d) A part of the silicon base layer is removed from a lower surface of the monolithic substrate to a position of the predetermined etching depth in the Step (c).

In order to have a further understanding of the present invention, the detailed content and the achieved efficacies of the present invention will be illustrated in detail below with the preferred embodiments, the accompanying drawings, and the numerals.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Referring to FIGS. 1A-1F, a method of forming a suspension object on a monolithic substrate according to the present invention is shown. The method includes the following steps.

(a) A monolithic substrate 1 is provided, in which the monolithic substrate 1 is composed of a silicon base layer 101 and a circuit layer 10 above the silicon base layer, the circuit layer 10 has at least one wet etching region 1c, and the wet etching region 1c extends downwards to a surface of the silicon base layer 101. In this embodiment, metal is used as a main material of the wet etching region 1c, but the material of the wet etching region 1c is not limited.

(b) The metal in the wet etching region 1c is removed until the silicon base layer 101 through wet etching.

(c) The silicon base layer 101 on a bottom of the wet etching region 1c is etched to a predetermined etching depth d through anisotropic dry etching. In addition, in order to enhance the dry etching effect of the bottom, a material of forming walls around the wet etching region 1c is oxide, such that silicon (Si) in the silicon base layer 101 on the bottom has a higher ion active action.

(d) A part of the silicon base layer 101 is removed from a lower surface of the monolithic substrate 1 to a position of the predetermined etching depth d in Step (c).

Figure 1A:
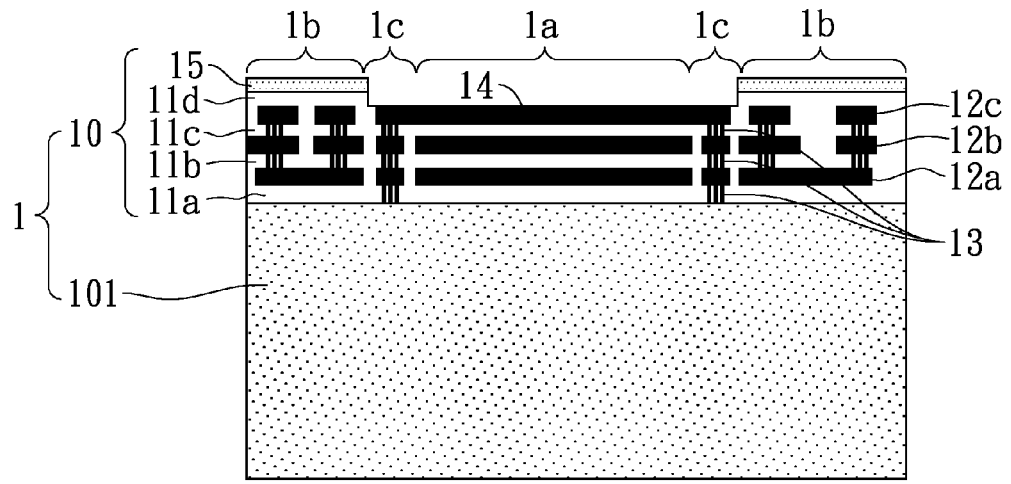
FIGS. 1A-1F are schematic partial cross-sectional views of a monolithic substrate in a method of forming a suspension object on a monolithic substrate according to the present invention.

FIG. 1A is a schematic partial cross-sectional view of the monolithic substrate 1 in Step (a). Referring to FIG. 1A, the monolithic substrate 1 is manufactured by using a CMOS standard process. The circuit layer 10 is formed on the silicon base layer 101 by alternately using a photolithographic process, a deposition process, and an etching process. The circuit board 10 includes a plurality of stagger-stacked non-metal layers (for example, silicon dioxide) 11a, 11b, 11c, and 11d and metal layers 12a, 12b, and 12c, the topmost non-metal layer 11d is formed on the topmost metal layer 12c, and the non-metal layers 11a, 11b, and 11c have a plurality of metal vias 13 used to connect the upper and lower metal layers 12a, 12b, and 12c.

A microstructure region 1a, a circuit region 1b, and a wet etching region 1c are defined on the metal layers 12a, 12b, and 12c and the non-metal layers 11a, 11b, 11c, and 11d of the circuit layer 10, in which the wet etching region 1c is disposed on most of the edges (not shown) of the microstructure region 1a between the circuit region 1b and the microstructure region 1a, so as to partition the circuit region 1b and the microstructure region 1a, and form a microstructure required by the microstructure region 1a. Each wet etching region 1c is formed by stagger-stacking the metal vias 13 disposed on the edge of the microstructure region 1a and the metal layers 12a, 12b, and 12c, such that the wet etching region 1c forms a structure having an aspect ratio being larger than 3:1 on the circuit layer 10 of the monolithic substrate 1. The wet etching region 1c further includes a positioning metal layer 14 covering above the microstructure region 1a. For the monolithic substrate during a CMOS post-process, through the positioning metal layer 14, a position of the wet etching region 1c may be precisely positioned, and the microstructure region 1a is prevented from being etched during a cap opening process of the post-process. A non-metal protective layer 15 is disposed above the circuit region 1b, so as to limit that the wet etching is only performed in the wet etching region 1c.

The wet etching region 1c is mainly used to carve the profile required by the microstructure region 1a. For most MEMS microstructures, a part of connected portion between the microstructure region 1a and the circuit region 1b is not entirely etched, such that the microstructure region 1a is stilled suspended on the monolithic substrate 1 after finishing the upper and the lower etching. If a micro movement of the microstructure region 1a in the monolithic substrate 1 is known through a capacitance change between the microstructure region 1a and the circuit region 1b, the microstructure region 1a further has several metal layers opposite to the metal layers of the circuit region 1b with the wet etching region 1c spaced therebetween, such that a distance between the microstructure region 1a and the circuit region 1b may be known by measuring a voltage change between the two metal layers. The voltage on the metal layer in the microstructure region 1a may also be measured through conducting the connected part between the microstructure region 1a and the circuit region 1b.

Figure 1B:
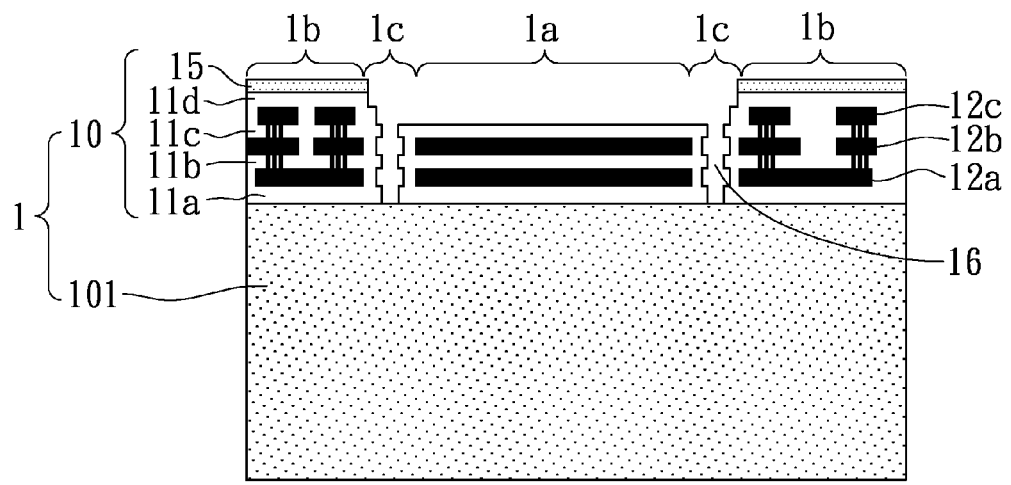

Referring to FIG. 1B, a metal etching is performed on the positioning metal layer 14 and the wet etching region 1c by using a metal etchant through the wet etching, so as to remove the positioning metal layer 14 and the metal materials stacked in the wet etching region 1c, till the silicon base layer 101, thereby exposing a part of an upper surface of the silicon base layer 101. Therefore, holes left in the wet etching region 1c after the circuit layer 10 is etched form an etching path 16 for etching the silicon base layer 101, and define the shape of the microstructure region 1a. The non-metal layers 11a, 11b, and 11c may be composed of oxides, for example, silicon dioxide, so as to prevent from damaging other structural parts during the metal wet etching.

Figure 1C:
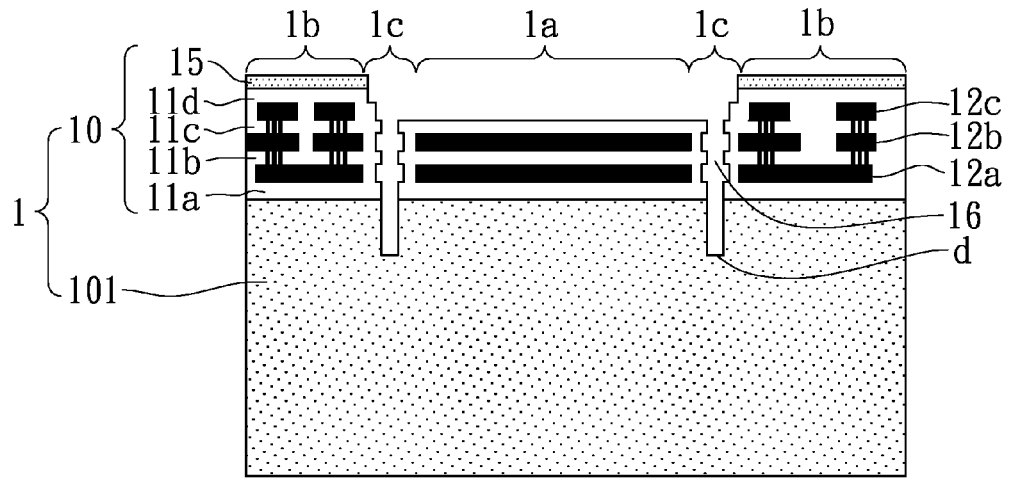
Figure 1D:
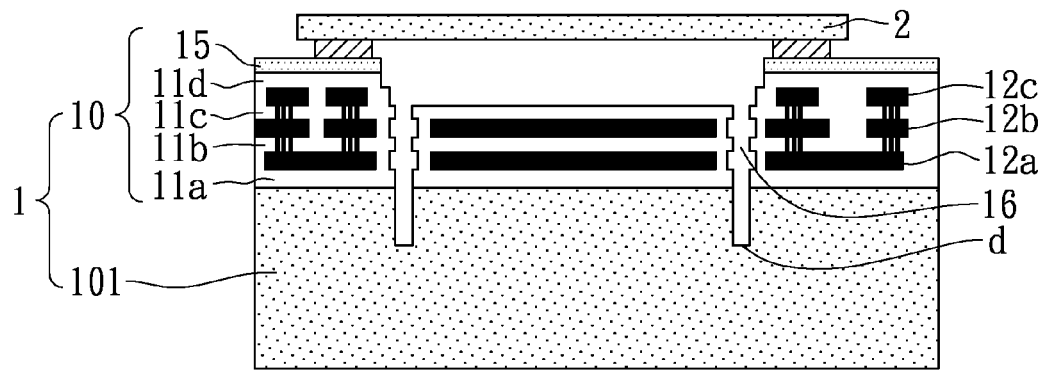

Referring to FIG. 1C, next, the position of the silicon base layer 101 on the bottom of the wet etching region 1c is etched through the previously formed etching path 16 with dry anisotropic DRIE to a predetermined etching depth d by controlling the etching time. After the etching is finished, a cap 2 packages above the microstructure region 1a, and the thickness of the silicon base layer 101 is reduced through grinding a lower surface of the silicon base layer 101, such that the thickness of the silicon base layer 101 is reduced to a predetermined thickness (as shown in FIG. 1D).

Figure 1E:
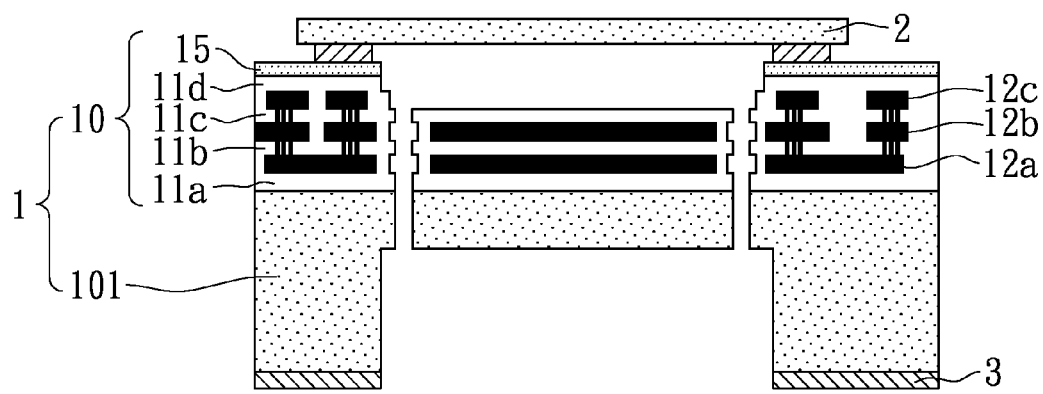
Figure 1F:
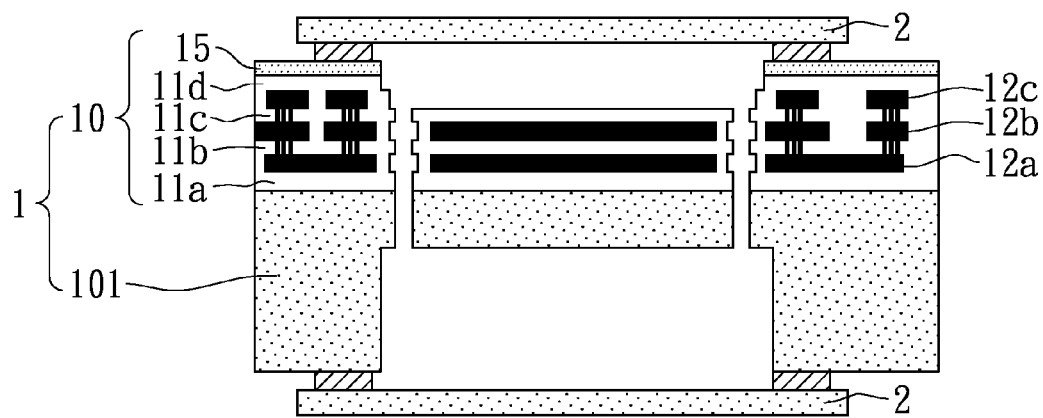

Next, referring to FIG. 1E, an etching barrier layer 3 is foamed on a position of the lower surface of the silicon base layer 101 with the reduced thickness opposite to the circuit region 1b, and the anisotropic dry etching is performed on the silicon base layer 101 under the microstructure region 1a and the wet etching region 1c from the lower surface of the silicon base layer 101 to the etching depth position d with the dry anisotropic DRIE, thereby releasing the microstructure region 1a. The microstructure region 1a is connected to the circuit region 1b through the un-etched connected portion, such that the microstructure region 1a forms the suspension object on the monolithic substrate 1. Further, in the step of etching the lower surface of the silicon base layer 101, the lower surface of the silicon base layer 101 may be etched through the wet etching according to process designs. Finally, another cap 2 packages a position below the silicon base layer 101 opposite to the microstructure region 1a (as shown in FIG. 1F). In the packaging step, a material of the caps 2 includes glass, silicon, or plastic.

Figure 2A:
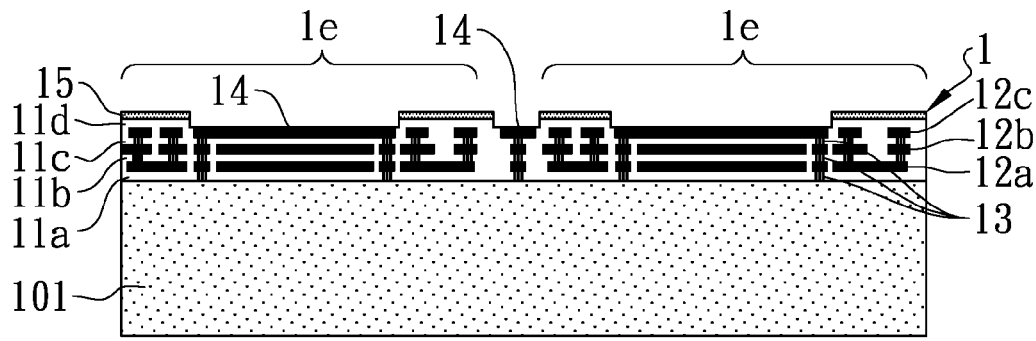
FIG. 2A is another schematic partial cross-sectional view of a monolithic substrate in a method of forming a suspension object on a monolithic substrate according to the present invention.
Figure 2B:
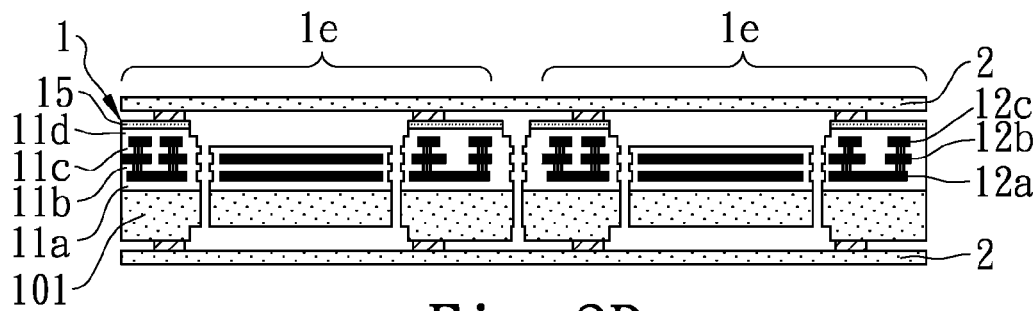
FIGS. 2B-2C are schematic views of steps of separating MEMS elements according to an embodiment of FIG. 2A.
Figure 2C:
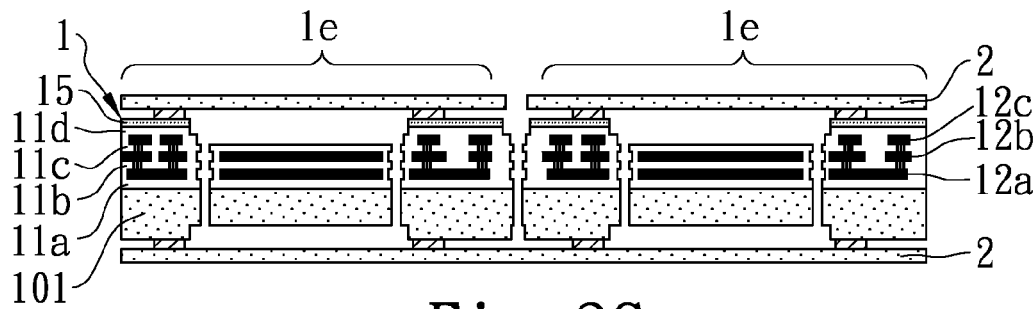
Figure 3:
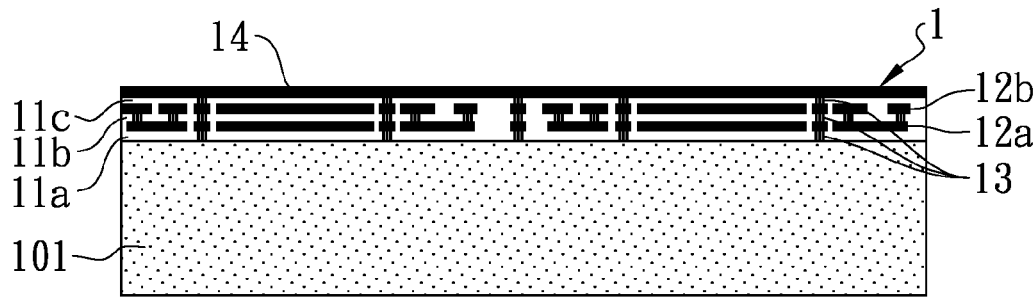
FIG. 3 is another schematic partial cross-sectional view of a monolithic substrate in a method of forming a suspension object on a monolithic substrate according to the present invention.
Figure 4A:
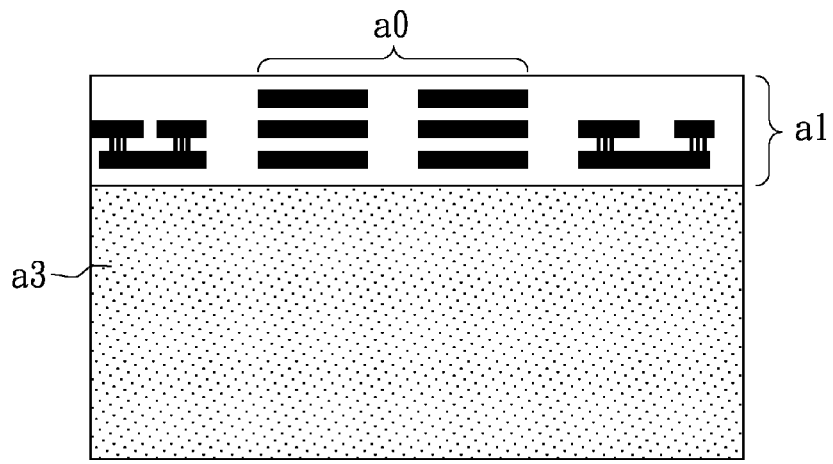
FIGS. 4A-4F are schematic views of steps of a conventional method of forming a suspension object on a monolithic substrate.
Figure 4B:
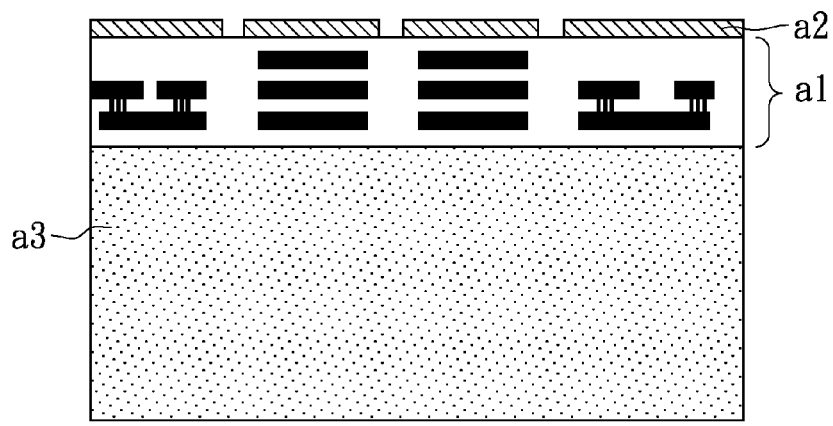
Figure 4C:
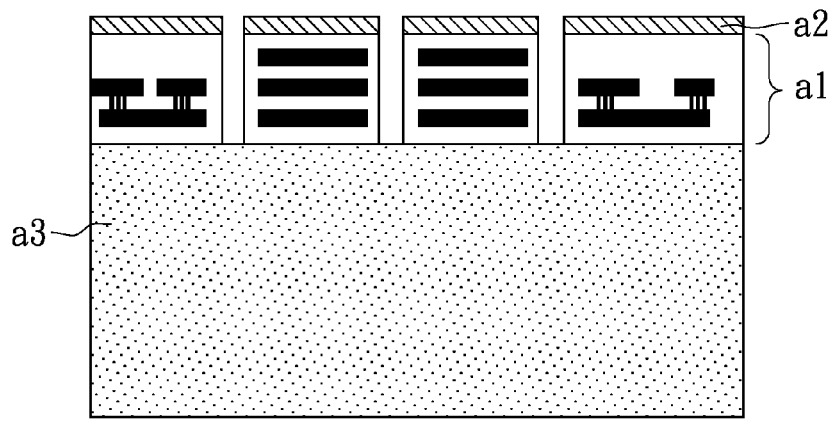
Figure 4D:
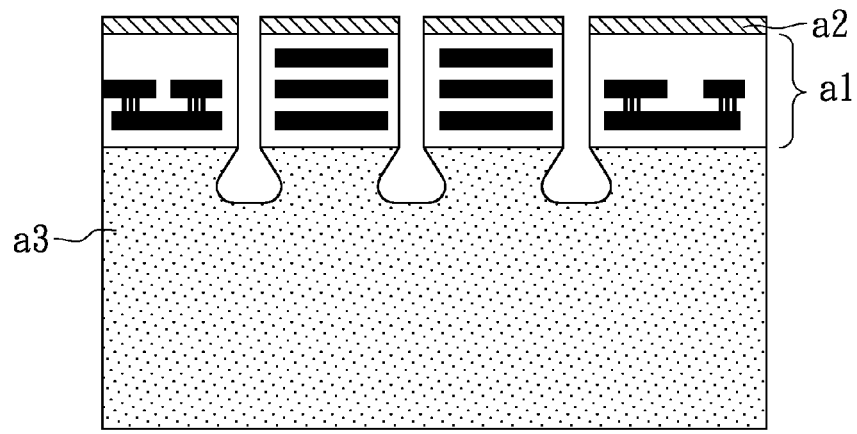
Figure 4E:
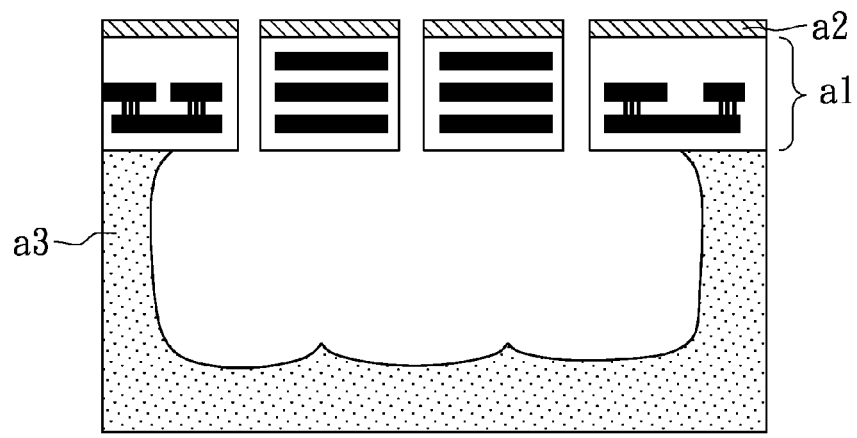
Figure 4F:
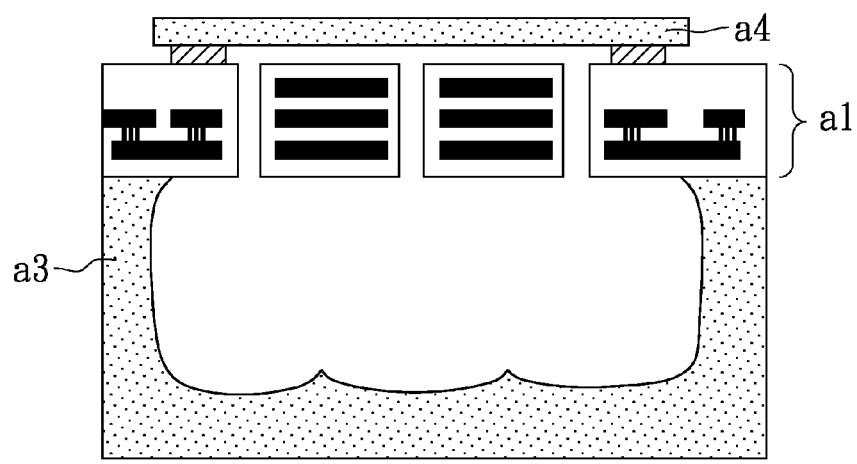
Figure 5A:
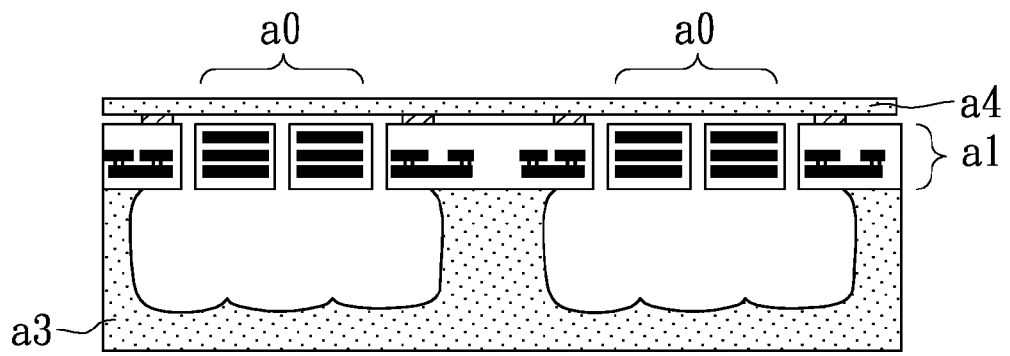
FIGS. 5A-5C are schematic views of steps of separating MEMS elements on a conventional monolithic substrate.
Figure 5B:
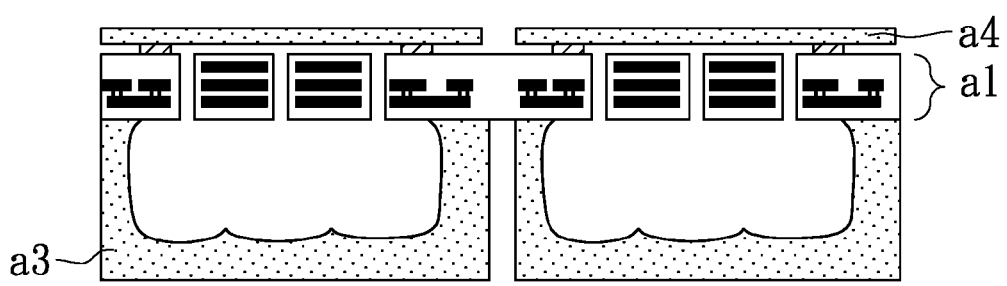
Figure 5C:
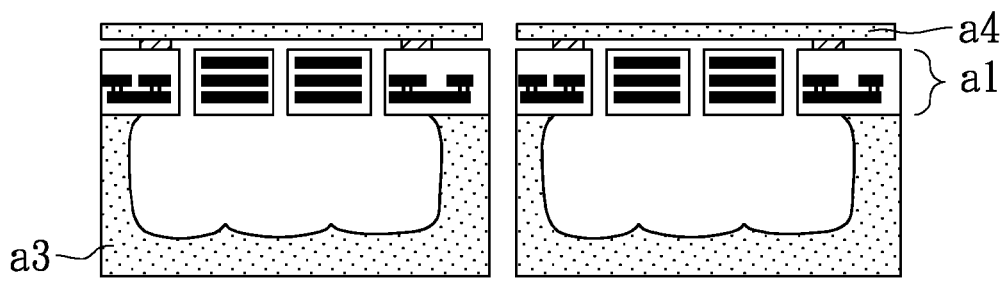

Referring to FIG. 2A, the circuit region 1b, the microstructure region 1a, and the wet etching region 1c form an MEMS element 1e on the monolithic substrate 1, and the monolithic substrate 1 has a plurality of MEMS elements 1e. The wet etching region 1c on the edge of the microstructure region 1a is disposed between the circuit regions 1b of neighboring MEMS elements 1e, so as to partition the circuit regions 1b of the neighboring MEMS elements 1e. A metal positioning layer 14 is disposed above the wet etching region 1c, such that during the wet etching step, when the positioning metal layer 14 on the wet etching region 1c and the metal stacked in the wet etching region 1c are removed to finish the step of suspending the microstructure region 1a, the MEMS elements 1e may be quickly separated by only cutting the caps 2 packaging above and below the monolithic substrate 1 on the position between the MEMS elements 1e (as shown in FIGS. 2B and 2C). In addition, a positioning metal layer 14 is disposed on each MEMS element 1e of the monolithic substrate 1, as shown in FIG. 3, the wet etching region 1c on the edge of the microstructure region 1a is disposed between the MEMS elements 1e, such that during the wet etching step, when the positioning metal layer 14 and the metal stacked in each wet etching region 1c are removed to finish the step of suspending the microstructure region 1a, the MEMS elements 1e may be quickly separated by only cutting the caps 2 packaging above and below the monolithic substrate 1 on the position between the MEMS elements 1e.

Therefore, the present invention has the following advantages.

1. In the present invention, the step of suspending the microstructure on the monolithic substrate is simplified, and a process time is effectively shortened, thereby reducing the manufacturing cost, such that the manufactured MEMS element has higher price competitiveness.

2. In the present invention, the wet etching method and the dry etching method are integrated, the vertical structural shape of the microstructure region is precisely etched on the wet etching region by using the wet etching, and the structure of the silicon base layer on the bottom of the microstructure region is precisely etched by using the dry DRIE, such that the etching progress and the accuracy of the manufactured product are surely controlled during the process, thereby maintaining the yield of the product.

3. In the present invention, through the structure of the silicon base layer under the MEMS element after the suspension, the structure of the MEMS element is strengthened and is prevented from being deformed, thereby obtaining a greater rigidity, and enhancing the durability and sensitivity thereof.

4. In the present invention, by adjusting the etching time of the dry DRIE, the required thickness of the MEMS element is obtained through etching, such that users select the thickness of the structural layer according to design demands, thereby enhancing the practicability of the process.

5. In the present invention, the process integrating the dry etching and the wet etching is simple, without any additional mask, or any exposure and development process, and the process has a high repeatability, and may be applied to a single chip having various types of MEMS elements and control circuits.

To sum up, according to the above disclosed content, the present invention may surely achieve the anticipated objects of the invention, in which a process integrating the dry etching and the wet etching is provided, so as to simplify and accelerate the process of the MEMS element, and precisely form the suspension microstructure on the monolithic substrate, which has a high industrial utility value, such that the present application is filed for an innovation patent according to the law.

What is claimed is:

1. A method of forming a suspension object on a monolithic substrate, comprising:
   (a) providing a monolithic substrate, wherein the monolithic substrate is composed of a silicon base layer and a circuit layer above the silicon base layer, the circuit layer has at least one wet etching region, and the wet etching region extends to a surface of the silicon base layer;
   (b) removing a material in the wet etching region until the silicon base layer through wet etching;
   (c) etching the silicon base layer on a bottom of the wet etching region to a predetermined etching depth through anisotropic dry etching; and
   (d) removing a part of the silicon base layer from a lower surface of the monolithic substrate to a position of the predetermined etching depth in Step (c).

2. The method of forming a suspension object on a monolithic substrate according to claim 1, wherein in Step (a), the wet etching region is formed by stacking a plurality of metal layers and a plurality of metal vias.

3. The method of forming a suspension object on a monolithic substrate according to claim 1, wherein in Step (a), an aspect ratio of the wet etching region is larger than 3:1.

4. The method of forming a suspension object on a monolithic substrate according to claim 1, wherein in Step (a), the monolithic substrate is manufactured by using a complementary metal oxide semiconductor (CMOS) standard process.

5. The method of forming a suspension object on a monolithic substrate according to claim 1, wherein in Step (a), the circuit layer has at least one circuit region and at least one microstructure region, and the wet etching region is disposed between the circuit region and the microstructure region.

6. The method of forming a suspension object on a monolithic substrate according to claim 5, wherein the circuit region and the microstructure region are partially connected.

7. The method of forming a suspension object on a monolithic substrate according to claim 5, wherein the wet etching region between the circuit region and the microstructure region partially covers above the microstructure region.

8. The method of forming a suspension object on a monolithic substrate according to claim 5, wherein Step (c) further comprises packaging above at least one microstructure region by a cap, after finishing the etching.

9. The method of forming a suspension object on a monolithic substrate according to claim 5, wherein Step (d) further comprises removing the silicon base layer under the microstructure region and the wet etching region through anisotropic dry etching.

10. The method of forming a suspension object on a monolithic substrate according to claim 5, wherein Step (d) further comprises reducing the thickness of the silicon base layer through grinding, and removing the silicon base layer under the microstructure region and the wet etching region through etching.

11. The method of forming a suspension object on a monolithic substrate according to claim 5, wherein Step (d) further comprises packaging a position below the silicon base layer opposite to the at least one microstructure region by a cap, after finishing the etching.

12. The method of forming a suspension object on a monolithic substrate according to claim 5, wherein in Step (a), the circuit layer has a plurality of circuit regions and a plurality of wet etching regions, and the wet etching region is disposed on a boundary of the circuit regions, so as to partition the circuit regions.

13. The method of forming a suspension object on a monolithic substrate according to claim 12, wherein the wet etching region used to partition the circuit regions in Step (a) partially covers above the circuit regions.

14. The method of forming a suspension object on a monolithic substrate according to claim 12, wherein Step (c) further comprises packaging above the monolithic substrate by a cap after finishing the etching.

15. The method of forming a suspension object on a monolithic substrate according to claim 14, wherein a material of the cap comprises glass, silicon, or plastic.

16. The method of forming a suspension object on a monolithic substrate according to claim 12, wherein Step (d) further comprises packaging below the monolithic substrate by a cap after finishing the etching.

17. The method of forming a suspension object on a monolithic substrate according to claim 16, wherein a material of the cap comprises glass, silicon, or plastic.

18. The method of forming a suspension object on a monolithic substrate according to claim 1, wherein the etching in Step (d) is dry etching or wet etching.

19. The method of forming a suspension object on a monolithic substrate according to claim 1, wherein in Step (c), the anisotropic dry etching is deep reactive ion etching (DRIE).

* * * * *